United States Patent
Brookes

(10) Patent No.: US 9,875,838 B2
(45) Date of Patent: Jan. 23, 2018

(54) SURFACE MOUNTABLE, TOROID MAGNETIC DEVICE

(71) Applicant: ROLLS-ROYCE PLC, London (GB)

(72) Inventor: David Brookes, Derby (GB)

(73) Assignee: ROLLS-ROYCE PLC, London (GB)

( * ) Notice: Subject to any disclaimer, the term of this patent is extended or adjusted under 35 U.S.C. 154(b) by 231 days.

(21) Appl. No.: 14/852,094

(22) Filed: Sep. 11, 2015

(65) Prior Publication Data
US 2016/0118176 A1  Apr. 28, 2016

(30) Foreign Application Priority Data
Oct. 28, 2014 (GB) .................... 1419162.1

(51) Int. Cl.
| | |
|---|---|
| H01F 27/28 | (2006.01) |
| H01F 27/10 | (2006.01) |
| H01F 27/02 | (2006.01) |
| H01F 27/22 | (2006.01) |
| H01F 27/06 | (2006.01) |
| H01F 30/16 | (2006.01) |
| H05K 1/02 | (2006.01) |
| H01F 27/24 | (2006.01) |
| H05K 1/18 | (2006.01) |
| H05K 3/34 | (2006.01) |

(52) U.S. Cl.
CPC .......... *H01F 27/22* (2013.01); *H01F 27/06* (2013.01); *H01F 27/24* (2013.01); *H01F 27/2895* (2013.01); *H01F 30/16* (2013.01); *H05K 1/0203* (2013.01); *H01F 2027/065* (2013.01); *H05K 1/181* (2013.01); *H05K 3/3421* (2013.01); *H05K 2201/1003* (2013.01); *H05K 2201/10568* (2013.01); *H05K 2201/2045* (2013.01)

(58) Field of Classification Search
USPC .......................................................... 336/229
See application file for complete search history.

(56) References Cited

U.S. PATENT DOCUMENTS

| | | | |
|---|---|---|---|
| 3,246,272 A * | 4/1966 | Wiley | H01F 5/00 174/138 G |
| 7,821,374 B2 | 10/2010 | Harrison et al. | |
| 7,847,662 B2 * | 12/2010 | Saito | H01F 17/041 29/602.1 |
| 8,624,702 B2 | 1/2014 | MacLennan et al. | |
| 2008/0018196 A1 * | 1/2008 | Enomoto | H02K 1/145 310/257 |
| 2009/0146769 A1 | 6/2009 | Feng et al. | |

(Continued)

FOREIGN PATENT DOCUMENTS

| | | |
|---|---|---|
| DE | 3321721 A1 | 12/1984 |
| DE | 3522740 A1 | 10/1986 |
| DE | 198 14 897 A1 | 10/1999 |

(Continued)

*Primary Examiner* — Ronald Hinson
(74) *Attorney, Agent, or Firm* — Oliff PLC

(57) ABSTRACT

A surface mountable, toroid magnetic device is provided, the device having a potting filling the central hole of the toroid. The potting extends axially beyond the base of the toroid to form a contact surface which, in use, contacts a mounting body for the device. Heat generated by the device flows by conduction through walls of the toroid defining the central hole into the potting and then through the contact surface into the mounting body.

10 Claims, 4 Drawing Sheets

(56) References Cited

U.S. PATENT DOCUMENTS

2011/0025441 A1    2/2011  Tien et al.

FOREIGN PATENT DOCUMENTS

| DE | 298 23 886 U1 | 3/2000 |
| DE | 19854642 A1 | 6/2000 |
| GB | 2 128 815 A | 5/1984 |
| GB | 2154068 A | 8/1985 |
| JP | H08250343 A | 9/1996 |
| JP | H11144977 A | 5/1999 |
| JP | 2002280234 A | 9/2002 |
| JP | 2005198147 A | 7/2005 |
| WO | 2005052964 A1 | 6/2005 |

* cited by examiner

| Surface Area (cm²) | Core Outside Diameter (mm) | Core Height (mm) | Mass of Core (g) |
|---|---|---|---|
| 13.6 | 16.5 | 6.35 | 6.78 |
| 18.9 | 20.3 | 6.35 | 9.40 |
| 26.3 | 23.6 | 8.89 | 19.9 |
| 33.8 | 26.9 | 11.2 | 35.8 |
| 48.0 | 33.0 | 10.7 | 46.9 |

SURFACE MOUNTABLE, TOROID MAGNETIC DEVICE

FIELD OF THE INVENTION

The present invention relates to a surface mountable, toroid magnetic device (e.g. a transformer or inductor) which can have improved thermal performance.

BACKGROUND OF THE INVENTION

Toroid transformers and inductors are often used in switch mode power supplies due to their good magnetic performance. Such toroid magnetic devices are normally mounted using one of the following approaches:

Mechanical bolting to part of the power supply structure and connection using flying leads.

Mechanical bolting to a PCB (printed circuit board) with lead-out connections made by hand.

Bonding to a through-hole mounting plate and soldering into a PCB.

Bonding to a surface-mount mounting plate and re-flow soldering to a PCB

Regardless of the mounting approach, the device temperature rise can be taken to be a function of surface area, one standard equation being:

$$\text{Temperature Rise (° C.)} = [\text{Power Dissipation (mW)} / \text{Surface Area (cm}^2)]^{0.833}$$

FIG. 1 shows a graph plotting temperature rise against power dissipation for five toroid transformers having different surface areas, with the Table below the graph providing approximate core diameters and heights for the five surface areas plotted (assuming approximately 40% winding factors). In many commercial applications these relatively high temperature rises are tolerable. However, in harsh environment, safety critical applications, such as aerospace engine controls, the allowable temperature rise may be limited to 35° C. in order to achieve required component life. Also, in order to achieve adequate thermal performance in higher temperature applications, the power dissipation of a toroid transformer (or inductor) may be limited to <2.5 W unless a large geometry core can be used.

With the increased desire for automated assembly, surface mount applications are becoming more common. However, in harsh environment applications with high vibration requirements (such as aerospace engines) the mass of surface mount components should be minimised, which is in direct contradiction to the need to increase the size of the component for improved thermal performance.

There is therefore a need for improved thermal management of surface mount toroid magnetic devices to enable use in safety critical, high temperature, harsh environment applications.

SUMMARY OF THE INVENTION

Accordingly, in a first aspect, the present invention provides a surface mountable, toroid magnetic device having a potting filling the central hole of the toroid, the potting extending axially beyond the base of the toroid to form a contact surface which, in use, contacts a mounting body for the device, whereby heat generated by the device flows by conduction through walls of the toroid defining the central hole into the potting and thence through the contact surface into the mounting body.

Advantageously, the potting provides a path for conductive heat flow which can improve thermal performance of the device, allowing the use of smaller devices with higher power densities. Further the device can be compatible with automated surface mount manufacture.

In a second aspect, the present invention provides an electrical circuit including a mounting body to which is mounted the device according to the first aspect.

In a third aspect, the present invention provides a switch mode power supply including the electrical circuit of the second aspect.

In a fourth aspect, the present invention provides an aerospace engine electronic controller having the switch mode power supply of the third aspect.

Optional features of the invention will now be set out. These are applicable singly or in any combination with any aspect of the invention.

The mounting body can be a PCB (printed circuit board).

The potting may also extend radially over the base of the toroid. In this way the contact area with the mounting body can be increased, improving heat flow into the body.

The contact surface may be substantially planar, e.g. for compatibility with a corresponding planar surface of the mounting body. The contact surface may be substantially perpendicular to the axis of the toroid.

The potting may fill the central hole of the toroid to at least ¾ of the depth of the hole. In this way, more heat can be drawn out of the device by the potting.

A top portion of the central hole may be filled with an elastomer, for example silicone. This can facilitate manipulation of the device using standard automated pick and place technology, e.g. used for building PCBs, as the top surface can be made compliant and even for compatibility with machine vacuum nozzles. The upper surface of the elastomer can be parallel with the contact surface to further facilitate the automated pick and place task. The upper surface of the elastomer may be level with the upper surface of the toroid, or indeed may extend radially over the upper surface of the toroid.

The potting can, conveniently, be formed of a resin loaded with thermally conductive particles, such as aluminium or graphite. The resin may be epoxy resin or another curable resin material.

The thermal conductivity of the potting may be at least 1 W/mK.

The coefficient of thermal expansion of the potting can be substantially the same as that of the magnetic core of the toroid. This can help to reduce mechanical stresses during thermal cycling.

The device may further have a carrier which supports the toroid, the carrier including fixing members (e.g. pins) for fixing (e.g. soldering) the device to the mounting body, wherein the coefficient of thermal expansion of the carrier is substantially the same as the coefficient of thermal expansion of the mounting body. The fixing members can be contacts for electrically connecting the device to electrical conductors of the mounting body.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Conventionally, heat loss from a toroid magnetic device is via convection and radiation. The present invention provides an additional thermal conduction path which can be compatible with automated surface mount manufacture.

Figure 1:
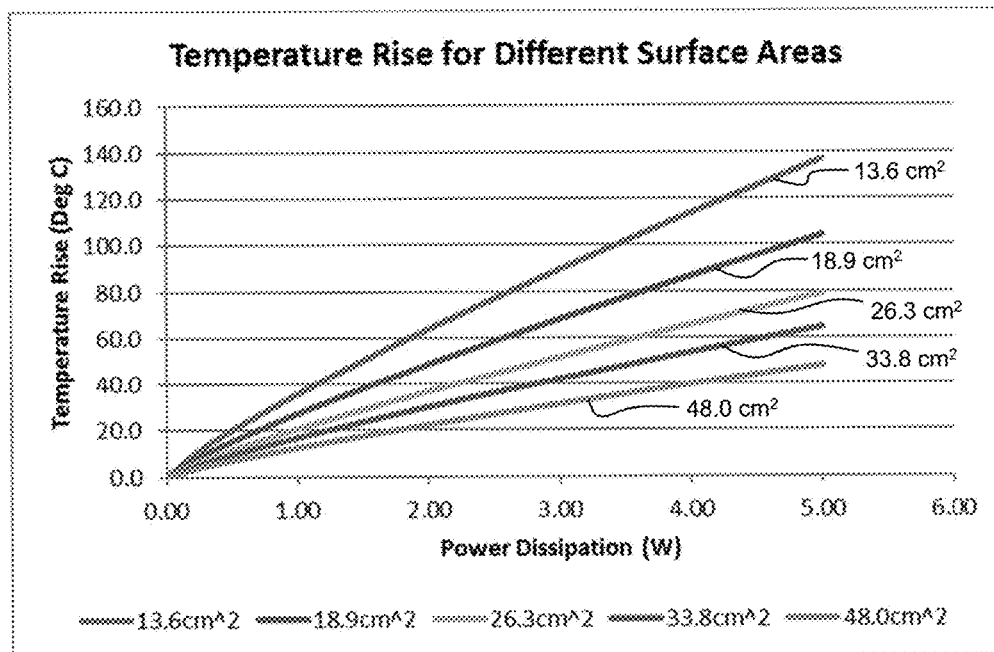
FIG. 1 shows a graph plotting temperature rise against power dissipation for five toroid transformers having different surface areas, with the Table below the graph providing approximate core diameters and heights for the five surface areas plotted (assuming approximately 40% winding factors)
Figure 2:
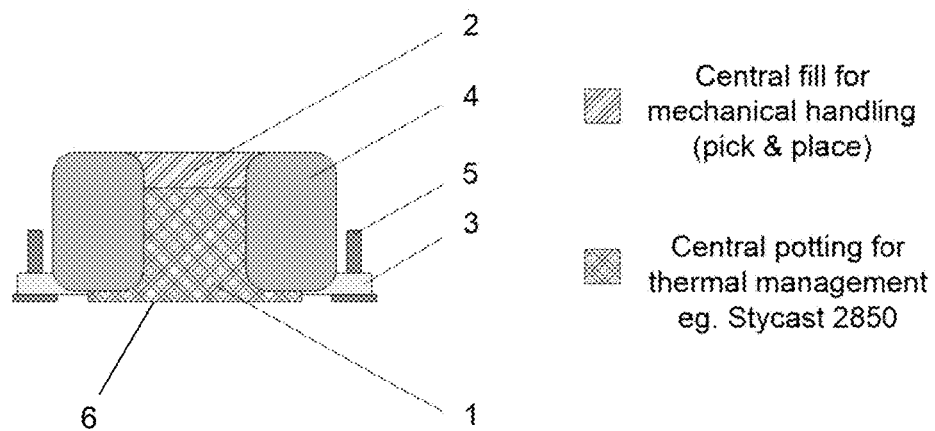
FIG. 2 shows schematically a cross-section through a toroid transformer with integrated thermal management.

FIG. 2 shows schematically a cross-section through a toroid transformer. The wound toroid 4 can be bonded to a carrier 3, e.g. a baseboard, which is formed out of a material with a similar coefficient of thermal expansion (CTE) to the PCB mounting body in the target application. The similarity of the materials' CTE helps to protect solder joints from fatigue failure during prolonged thermal cycling. The central hole of the toroid 4 is filled with thermally conductive potting material 1, such as epoxy (e.g. Stycast 2850™) loaded with aluminium particles. Magnetic materials used in toroid cores generally have low coefficients of thermal expansion, and therefore the CTE of the central potting material can also have a similarly low value in order to reduce mechanical stresses during thermal cycles.

The potting 1 extends axially beyond the base of the toroid 4, and preferably also extends radially over the base of the toroid, to form a contact surface 6 which, in use, is held in close contact with the PCB. Typically the contact surface is planar and normal to the axis of the toroid. In this way, a thermal conduction path is created between the windings of the toroid 4 and the PCB that the transformer is mounted to, with the PCB acting as a heat-sink. This can remove a need for a separate additional heat sink for the transformer.

The carrier can have fixing members 5, e.g. in the form of pins, for soldering the transformer to the PCB. Indeed, the fixing members may be contacts for electrically connecting the transformer to electrical conductors of the PCB. Further fixing members may be added to the carrier for additional mechanical support with no electrical connection. To ensure that the contact surface 6 makes close contact with the PCB, the contact surface 6 can be co-planar with the undersides of the fixing members.

The potting 1 preferably fills the central hole of the toroid to at least ¾ of the depth of the hole. In this way, the potting can help to draw more of the heat generated by the toroid windings and core losses out of the device. However, the top portion of the hole may be filled with an elastomer 2, such as high temperature silicone, which can stick to the uneven outside surface of the wound toroid to become an integral part of the transformer. The upper surface of elastomer can be planar and parallel with the contact surface 6. The elastomer can also extend radially over the upper surface of the toroid. The elastomer facilitates manipulation of the transformer using standard automated pick and place technology for building PCBs though providing an even compliant surface compatible with vacuum nozzle pick and place machines.

Figure 3:
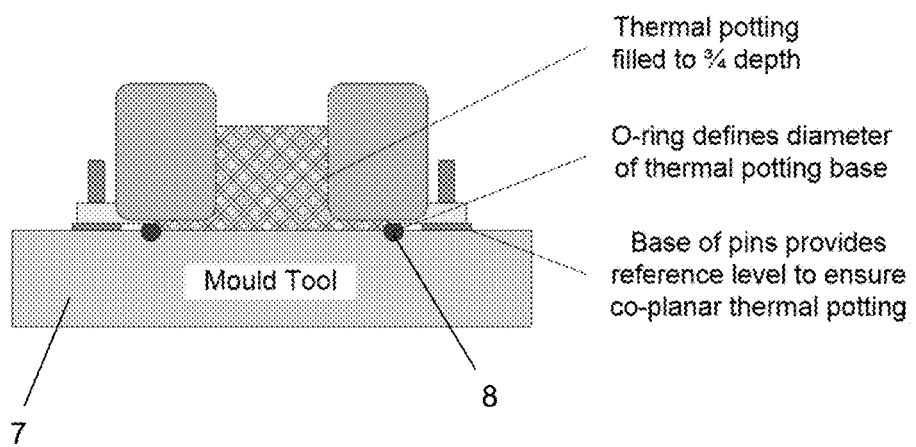
FIG. 3 shows schematically a first stage in a fabrication process for the transformer of FIG. 2.

FIG. 3 shows schematically a first stage in the fabrication of the transformer. The toroid 4 and carrier 3 are pressed on to a mould tool 7, with the undersides of the fixing members 5 contacting the tool. The tool has an O-ring 8 which seals against the base of the toroid such that when the potting 1 is filled into the central hole of the toroid, the O-ring defines the outer diameter of the potting. The undersides of the fixing members 5 provide a reference level corresponding to the plane of the contact surface 6.

Figure 4:
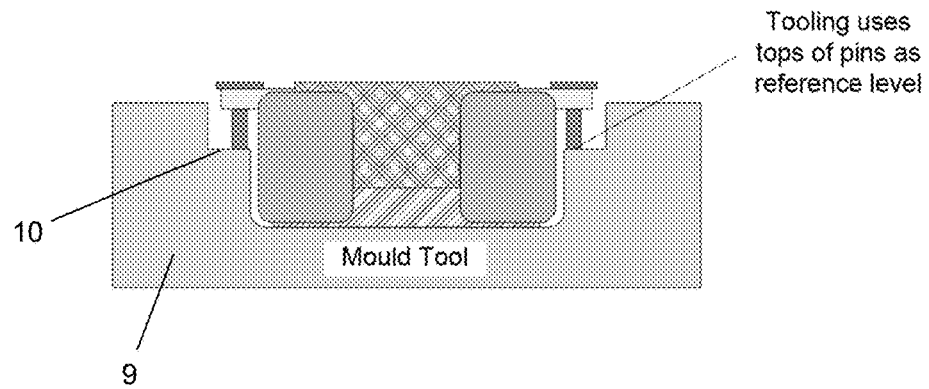
FIG. 4 shows schematically a second stage in the fabrication process.

FIG. 4 shows schematically a second stage in the fabrication of the transformer. The toroid 4 and carrier 3, now with the central hole ¾ filled with potting 1, are inverted into a recess of a second mould tool 9. The upper sides of the fixing members 5 engage a step formation 10 around the perimeter of the recess, causing the top surface of the toroid to be raised a small distance above the base of the recess and ensuring a level upper surface for the elastomer 2.

Alternatively, as a second stage in the fabrication process, the elastomer can simply be poured into the central hole and allowed to self-level under gravity.

Figure 5:
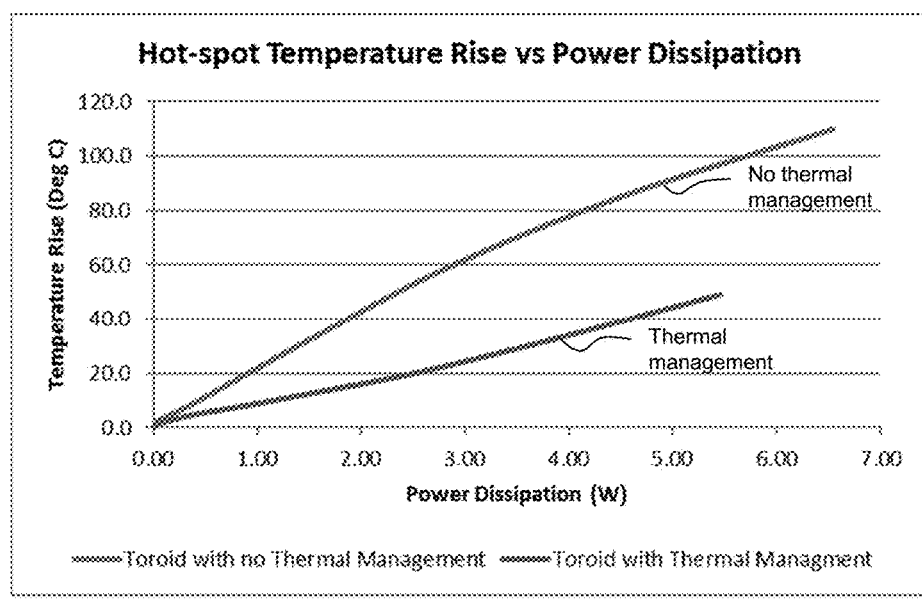
FIG. 5 shows a graph plotting temperature rise against power dissipation for a toroid transformer without the potting filling and thermal conduction path of the present invention, and the same transformer with the potting filling and thermal conduction path of the present invention.

FIG. 5 shows a graph plotting temperature rise against power dissipation for a toroid transformer without the potting filling and thermal conduction path of the present invention, and the same transformer with the potting filling and thermal conduction path of the present invention. Through such practical testing it can be shown that the temperature rise is significantly reduced for a given power dissipation. This improved thermal performance can allow for the use of a smaller device with e.g. a two fold increase in power density.

Figure 6:
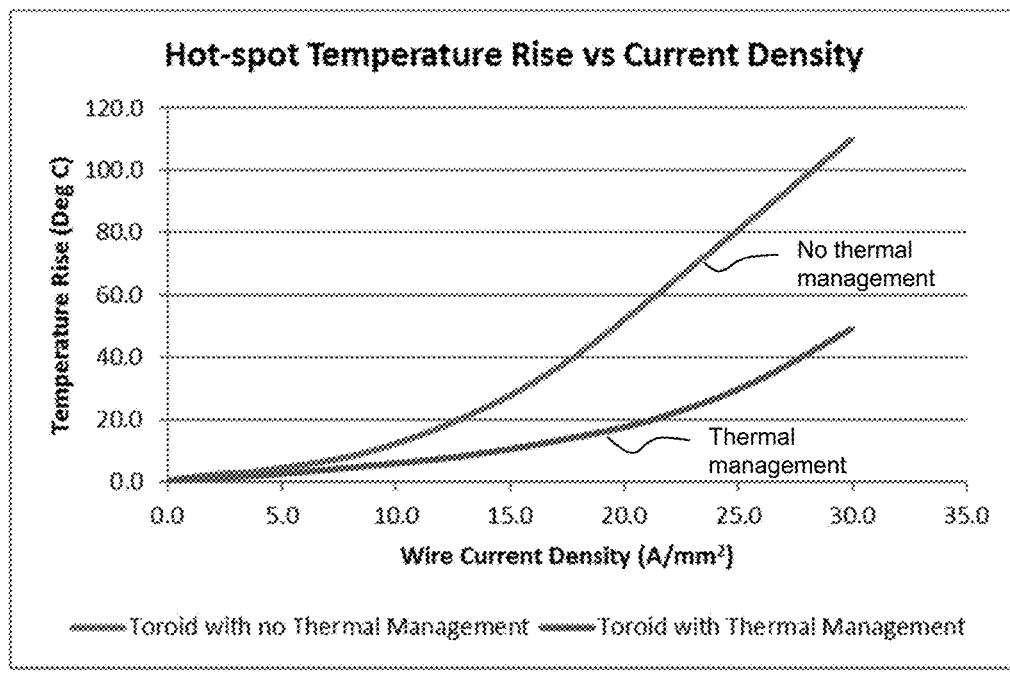
FIG. 6 shows a graph plotting hot-spot temperature rise against wire current density for a toroid transformer without the potting filling and thermal conduction path of the present invention, and the same transformer with the potting filling and thermal conduction path of the present invention

FIG. 6 shows a graph plotting hot-spot temperature rise against wire current density for a toroid transformer without the potting filling and thermal conduction path of the present invention, and the same transformer with the potting filling and thermal conduction path of the present invention. The improved thermal management allows smaller cross section conductors to be used with an increased current rating (defined as current density measured in A/mm$^2$) again allowing for higher density devices.

The toroid transformer described above, with its improved thermal management, is particularly applicable for use in the high-value aerospace electronics (e.g. PCBs for the engine electronic controller). However, it can also have other harsh environment applications, such as in oil and gas industry downhole applications.

While the invention has been described in conjunction with the exemplary embodiments described above, many equivalent modifications and variations will be apparent to those skilled in the art when given this disclosure. For example, the device described above is a toroid transformer, but the principals defined extend to other toroid magnetic devices such as inductors. Accordingly, the exemplary embodiments of the invention set forth above are considered to be illustrative and not limiting. Various changes to the described embodiments may be made without departing from the spirit and scope of the invention.

The invention claimed is:

1. An electrical circuit including a mounting body to which is mounted a toroid magnetic device having a potting filling a central hole of a toroid of the device, the potting extending axially beyond the base of the toroid to form a contact surface which, in use, contacts a mounting body for the device, whereby heat generated by the device flows by conduction through walls of the toroid defining the central hole into the potting and thence through the contact surface into the mounting body, the device further having a carrier which supports the toroid, the carrier including fixing members which fix the device to the mounting body, wherein the coefficient of thermal expansion of the carrier is substantially the same as the coefficient of thermal expansion of the mounting body, wherein a top portion of the central hole is filled with an elastomer composed of a different material than the potting.

2. An electrical circuit according to claim 1, wherein the potting also extends radially over the base of the toroid.

3. An electrical circuit according to claim 1, wherein the potting fills the central hole of the toroid to at least ¾ of the depth of the hole.

4. An electrical circuit according to claim 1, wherein the potting is formed of a resin loaded with thermally conductive particles.

5. An electrical circuit according to claim 1, wherein the thermal conductivity of the potting is at least 1 W/mK.

6. An electrical circuit according to claim 1, wherein the coefficient of thermal expansion of the potting is substantially the same as that of the magnetic core of the toroid.

7. An electrical circuit according to claim 1, wherein the contact surface is planar and makes close contact with a corresponding planar surface of the mounting body.

8. An electrical circuit according to claim 7, wherein undersides of the fixing members are co-planar with the contact surface.

9. A switch mode power supply including the electrical circuit of claim 1.

10. An aerospace engine electronic controller having the switch mode power supply of claim 9.

* * * * *